(12) United States Patent
Singh et al.

(10) Patent No.: US 6,277,544 B1
(45) Date of Patent: Aug. 21, 2001

(54) REVERSE LITHOGRAPHIC PROCESS FOR SEMICONDUCTOR SPACES

(75) Inventors: Bhanwar Singh, Morgan Hill; Bharath Rangarajan, Santa Clara; Ursula Q. Quinto, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/329,153

(22) Filed: Jun. 9, 1999

(51) Int. Cl.$^7$ ........................................................ G03C 5/00
(52) U.S. Cl. ........................... 430/313; 430/314; 430/329
(58) Field of Search ................................... 430/313, 329, 430/314; 134/1.2

(56) References Cited

U.S. PATENT DOCUMENTS

| | | | |
|---|---|---|---|
| 4,973,544 | * 11/1990 | Slayman et al. | 430/323 |
| 5,510,216 | * 4/1996 | Calabrese et al. | 430/16 |
| 5,716,758 | * 2/1998 | Bae et al. | 430/312 |
| 5,741,625 | * 4/1998 | Bae et al. | 430/312 |
| 5,750,441 | 5/1998 | Figura et al. | 438/751 |
| 5,811,357 | 9/1998 | Armacost et al. | 438/423 |
| 5,834,159 | * 11/1998 | Stolmeijer | 430/312 |
| 5,897,984 | * 4/1999 | Kubota et al. | 430/320 |
| 5,908,735 | * 6/1999 | Kim et al. | 430/329 |
| 5,935,765 | * 8/1999 | Tanaka et al. | 430/315 |
| 5,981,385 | * 11/1999 | Huang | 438/672 |
| 6,022,669 | * 2/2000 | Uchida et al. | 430/313 |
| 6,027,858 | * 2/2000 | Jones et al. | 430/311 |
| 6,063,702 | * 5/2000 | Chung | 438/624 |
| 6,074,803 | * 6/2000 | McGrath et al. | 430/311 |
| 6,080,662 | 6/2000 | Chen et al. | 438/637 |

FOREIGN PATENT DOCUMENTS

559934 * 9/1993 (EP).

* cited by examiner

Primary Examiner—C. H. Kelly
(74) Attorney, Agent, or Firm—Mikio Ishimaru

(57) ABSTRACT

A reverse lithographic process is provided for more densely packing semiconductors onto a semiconductor wafer. A semiconductor wafer having deposited a number of layers of semiconductor materials has a photoresist deposited which is patterned with the spaces as lines, and then developed and trimmed. A polymer is deposited over the space photoresist structures and, when hardened, is subject to planarizing to expose the photoresist. The photoresist is removed leaving a reverse image polymer which is then used as a mask to anisotropically etch the spaces to form the closely spaced devices.

20 Claims, 3 Drawing Sheets

REVERSE LITHOGRAPHIC PROCESS FOR SEMICONDUCTOR SPACES

CROSS-REFERENCE TO RELATED APPLICATIONS

The present application contains subject matter related to a concurrently filed U.S. Patent Application by Bhanwar Singh, Bharath Rangarajan, and Ursula Q. Quinto entitled "REVERSE LITHOGRAPHIC PROCESS FOR SEMI-CONDUCTOR VIAS", Ser. No. 09/329,154, filed Jun. 6, 1999, now U.S. Pat. 6,221,777. The related application is assigned to Advanced Micro Devices, Inc.

TECHNICAL FIELD

The present invention relates generally to manufacturing of sub-micron semiconductors and more specifically to providing more densely packed semiconductor devices.

BACKGROUND ART

An integrated circuit includes a large number of closely spaced semiconductor devices formed into and on a semiconductor substrate, typically comprising silicon. Isolation structures such as field dielectrics or shallow trench dielectrics are used to electrically isolate each individual device. A major goal in the semiconductor industry has been to reduce device size and spacing to achieve denser and denser packing.

The main limitation of minimum feature size, i.e., lines and spaces, in a semiconductor process is the resolution of the optical lithography printing system. In an optical lithography printing system, radiation is directed from an illumination source through a patterned mask and onto a photoresist to reproduce the mask pattern in the photoresist. Resolution in optical lithography systems is limited by diffraction effects, which spread radiation from the illumination source into regions of the photoresist which are not directly exposed to the illumination source. Because of these diffraction effects, while it is possible to closely control the width of lines, it is very difficult, if not impossible, to control the spacing between lines.

The resolution of a lens depends on the wavelength of the illumination source and the numerical aperture of the lens. Rayleigh's criteria define two images as being resolvable when the intensity between them drops to 50% of the image intensity. These criteria are the 2d=0.61 lambda/NA, where 2d is the separation distance of two images, lambda is the wavelength of the energy source, and NA is the numerical aperture of the lens.

Commercially available optical photolithography machines are almost universally equipped with mercury vapor lamps as the illumination source. The characteristic energy spectrum of a mercury vapor lamp contains several distinct peaks at 365 nm, 248 nm, and 193 nm wavelengths. These peaks are commonly referred to by their industry designations. The peak associated with a wavelength of about 365 nm peak is the "I-line" and peaks at about 248 nm and 193 nm are deep ultra-violet or "DUV".

Photolithography aligners are similarly designated such that it is common to speak of "I-line aligners" and "DUV aligners". The DUV aligners utilizing energy having wavelengths of 248 nm and 193 nm to achieve better resolution than is achievable with I-line aligners.

As process technologies approach and surpass the resolvable limits of optical aligners, semiconductor manufacturers are forced to implement alternative photolithography techniques to achieve adequate resolution of the minimum features. Unfortunately, the conventional alternatives involve abandoning or substantially modifying the existing photolithography equipment at a prohibitive cost. Many wafer fabrication facilities, for example, have extensive capital investment in I-line aligners. To adequately resolve features in the sub-micron range, it is typically necessary to upgrade these aligners. Similarly, fabrication facilities with extensive investment in I-line aligners will eventually need to upgrade to DUV aligners or abandon the optical alignment equipment entirely and replace it with advanced lithography equipment including e-beam or x-ray lithography.

The cost associated with replacing or upgrading I-line and DUV photolithography equipment can be staggering. In addition to the capital required to purchase and install the improved equipment, there are extensive costs associated with qualifying the new equipment for production worthiness and training production and maintenance personnel in the operation and care of the new equipment. Similarly, in fabrication facilities that have extensive investments in I-line and DUV aligners, the costs of abandoning these aligners to achieve more densely packed devices is tremendous.

Thus, there have been intensive efforts to discover ways of using existing equipment and processes to achieve even incremental improvements in reducing spaces between and within semiconductor devices.

DISCLOSURE OF THE INVENTION

The present invention provides a reverse lithographic process for more densely packing semiconductor devices onto a semiconductor wafer. A photoresist is deposited on a semiconductor wafer which has a number of layers of semiconductor materials deposited thereon. The photoresist is patterned in a reverse photolithographic pattern with the spaces as lines. The photoresist is developed. If it is desired to make smaller spaces, the photoresist is accurately sized by plasma trimming. A polymer is deposited over the space photoresist structures. The polymer, when hardened, is subject to chemical-mechanical polishing to planarize the polymer and expose the space photoresist structures. The photoresist is then developed leaving the polymer in a reverse image of the spaces. The polymer is then used as a mask to etch the spaces. After the spaces are formed, the polymer is removed.

The present invention provides for more densely packed semiconductor devices on a semiconductor wafer by mask bias, optical proximity correction, registering process, or having smaller spaces between the semiconductor devices. The process of making fine lines by overexposure of the photoresist during the stepper-patterning sequence is used in a reverse lithographic process to form small spaces between semiconductor devices. Small spaces are difficult to pattern at underexposure conditions because scumming and bridging occurs.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
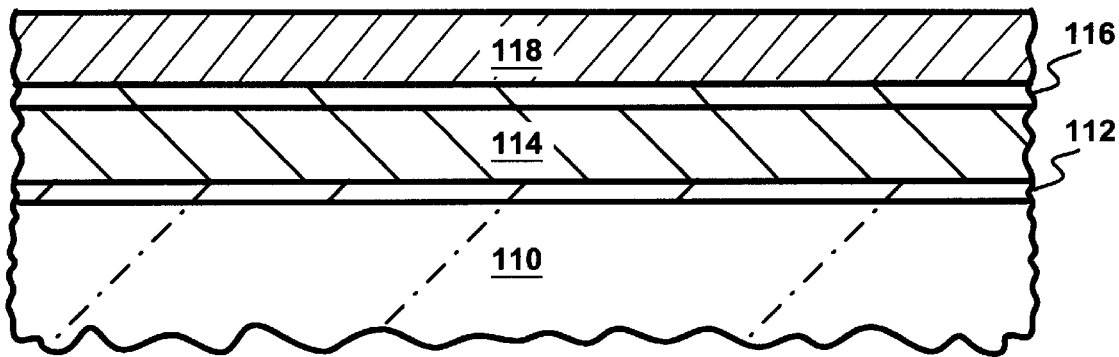
FIG. 1 is a partial cross-sectional view of a semiconductor wafer in a preliminary stage of manufacturing after a number of layers of semiconductor materials including a photoresist have been deposited.

Referring now to FIG. 1, therein is shown a partial cross-sectional view of a semiconductor wafer 100 in a preliminary stage of manufacturing. In the preferred embodiment which is for a silicon-based semiconductor, the wafer 100 at this stage of manufacturing will consist of a lightly doped silicon substrate 110 with a gate dielectric layer 112 deposited thereon. On top of the gate dielectric layer 112 is a gate polysilicon layer 114 and an anti-reflective layer 116. Also shown as part of the first step of the present invention is a photoresist 118. For sub-micron geometries, the photoresist 118 will generally be an I-line or a deep ultraviolet (DUV) photoresist which is deposited by spin coating. In the preferred embodiment, the gate dielectric layer 112 is silicon dioxide ($SiO_2$) and the anti-reflective layer 116 is of silicon oxynitride (SiON).

Figure 2:
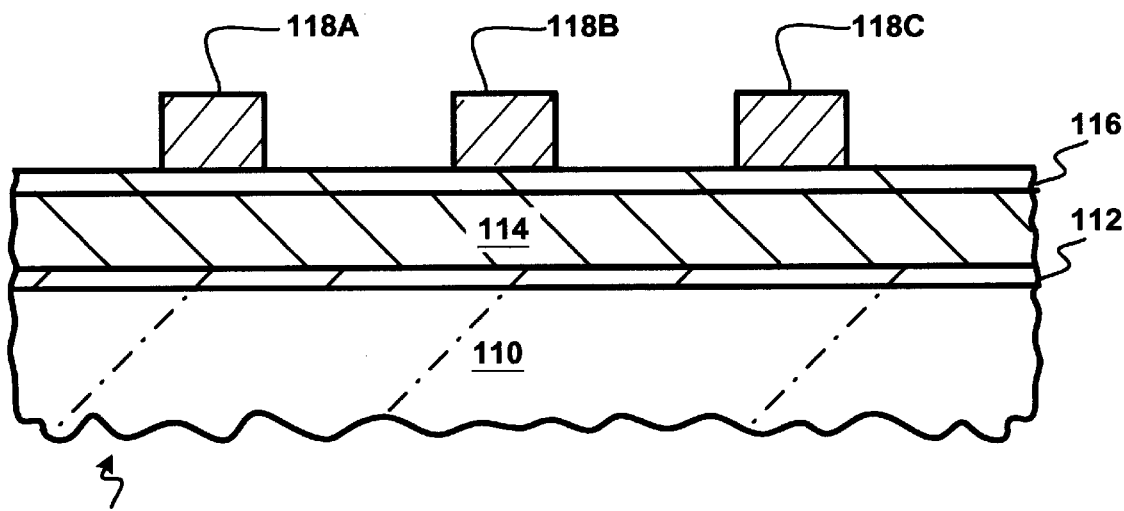
FIG. 2 is a partial cross-sectional view of FIG. 1 after the photoresist has been patterned with the spaces as the lines and developed to form space photoresist structures.

Referring now to FIG. 2, therein is shown the structure of FIG. 2 in which the photoresist 118 has been patterned with the desired spaces in the same way that conventional lines are patterned in a conventional photolithographic process. Any photolithographic process can be used. In the preferred embodiment, a mask is used which allows exposure of the photoresist to light and the photoresist is developed and removed where it has been exposed to the light. The process of making fine lines by overexposure of the photoresist during the stepper-patterning sequence may also be used here to control the width of the photoresist lines which will later be the spaces. The formation of small spaces is normally difficult to pattern using conventional processes even at underexposure conditions because scumming and bridging occurs.

Figure 3:
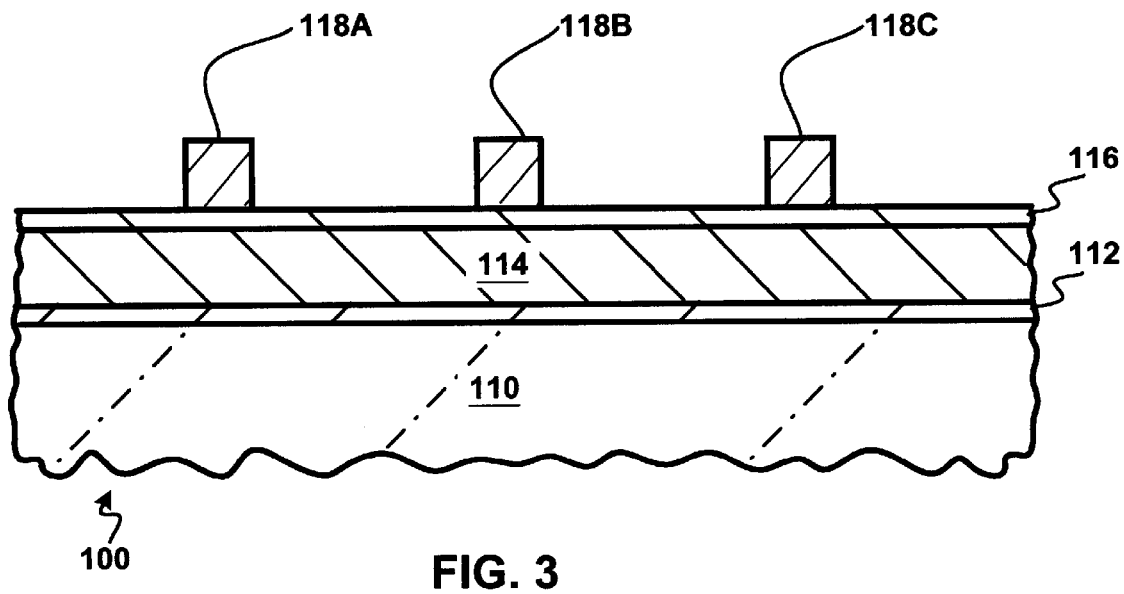
FIG. 3 is a partial cross-sectional view of FIG. 2 after the space photoresist structures have been trimmed.

Referring now to FIG. 3, the photoresist 118 is developed to form space photoresist structures 118A through 118C. As an option, to tightly control the size of the spaces, the space photoresist structures 118A through 118C are dry trimmed by plasma etching to very precise widths.

Figure 4:
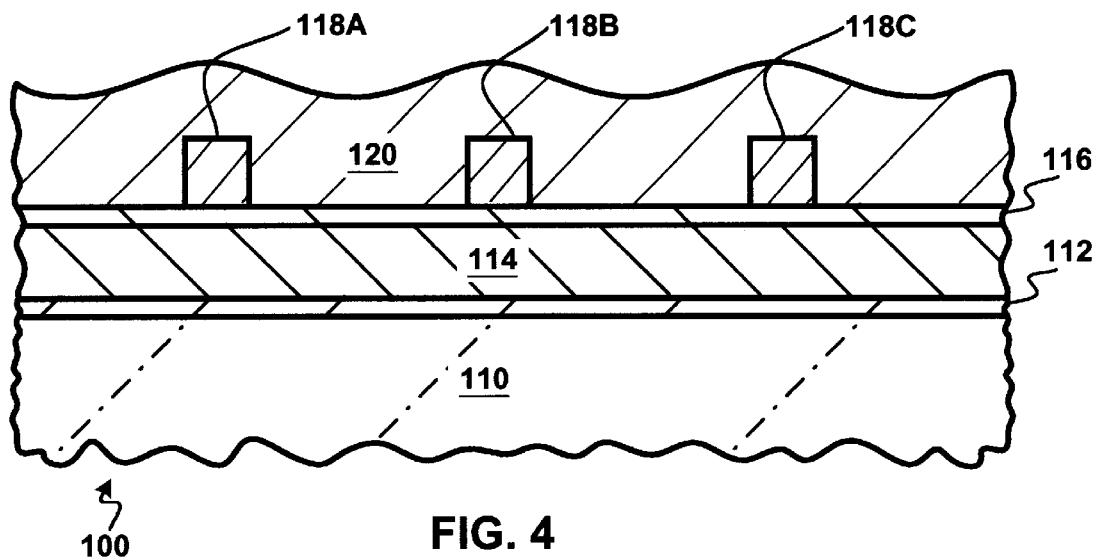
FIG. 4 is a partial cross-sectional view of FIG. 3 after a polymer has been spun on over the trimmed space photoresist structures.

Referring now to FIG. 4, therein is shown the structure of FIG. 3 after the plasma trimming of the spaces. A polymer 120 is deposited over the space photoresist structures 118A through 118C. The polymer 120 is a non-photosensitive polymer which is generally deposited by spin coating or plasma polymerization. Its thickness should be greater than the thickness of the space photoresist structures 118A through 118C.

Figure 5:
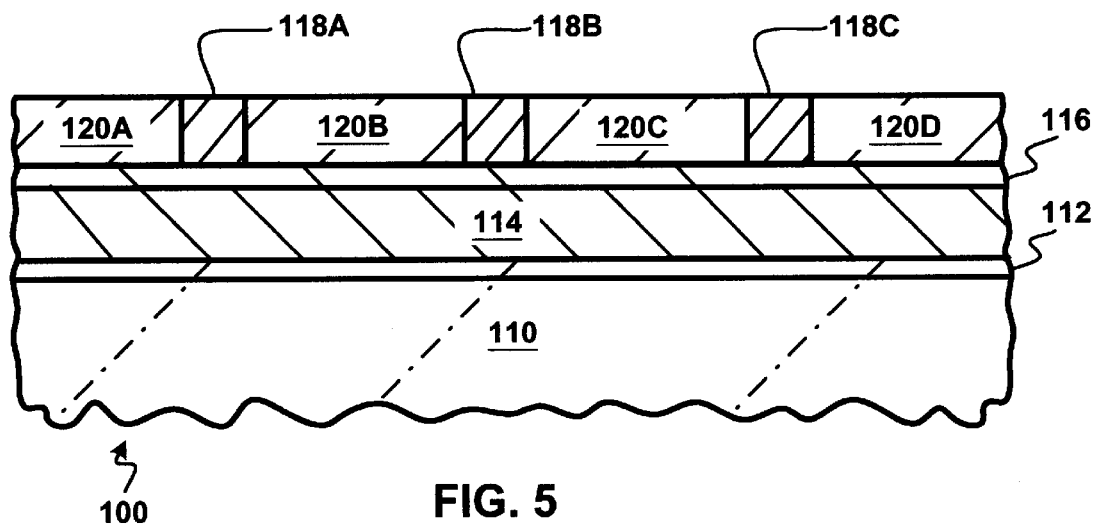
FIG. 5 is a partial cross-sectional view of FIG. 4 after the polymer has been hardened and subject to a chemical-mechanical polishing to expose the photoresist.

Referring now to FIG. 5, therein is shown the structure of FIG. 4 after chemical-mechanical polishing (CMP) of the polymer 120 until the space photoresist structures 118A through 118C are revealed and reverse image polymer structures 120A through 120C are planarized and formed.

Figure 6:
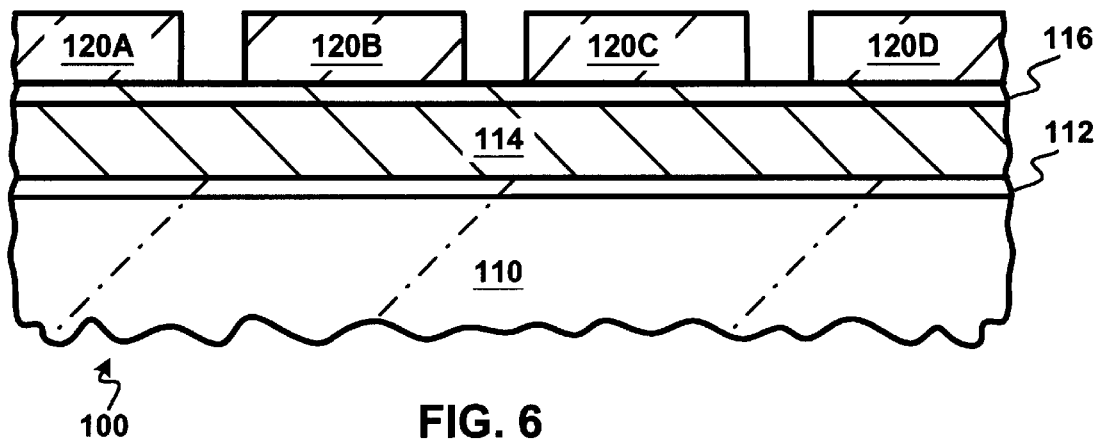
FIG. 6 is a partial cross-sectional view of FIG. 5 in which the photoresist has been removed leaving the reverse image polymer.

Referring now to FIG. 6, therein is shown the structure of FIG. 5 after developing to remove the space photoresist structures 118A through 118C. This leaves the reverse image polymer structures 120A through 120C on the anti-reflective layer 116.

Figure 7:
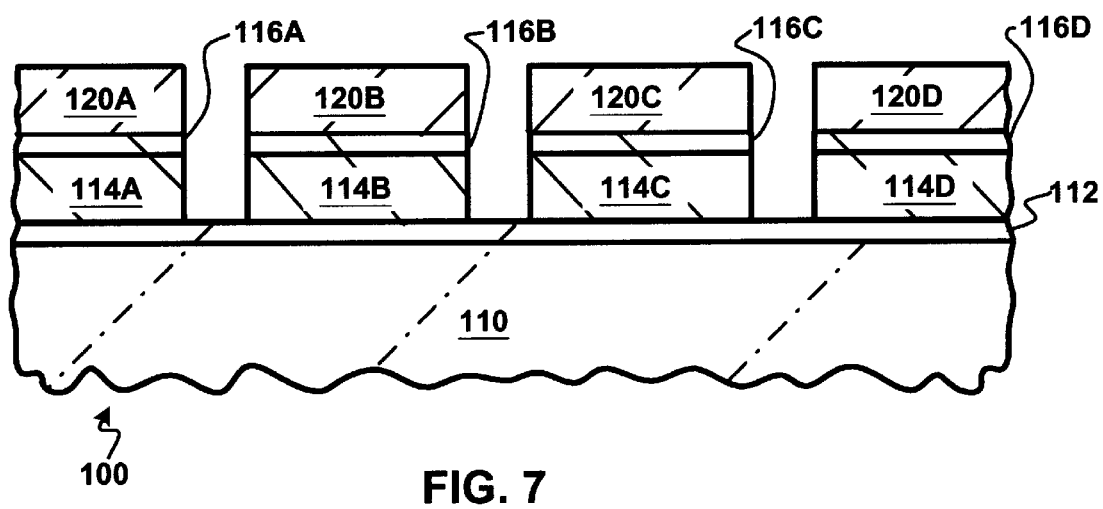
FIG. 7 is a partial cross-sectional view of FIG. 6 in which the reverse image polymer has been used as a mask in the etching of the spaces to form the closely spaced semiconductor devices.

Referring now to FIG. 7, therein is shown the structure of FIG. 6 after an anisotropic etch which uses the reverse image polymer structures 120A through 120C to form a plurality of semiconductor structures or gate stacks. The gate stacks consist of the gate dielectric layers 112A through 112C, the polysilicon gates 114A through 114C, and the anti-reflective layers 116A through 116C.

The present invention may be described as a reverse lithographic process in which the reverse images of the spaces in a polymer are used to form precisely defined spaces, which currently cannot be manufactured using existing processes on existing equipment. The present invention is described beginning with a semiconductor wafer 100 which has been processed to the point that gate formation should be initiated. The wafer generally has the gate dielectric layer 112, the gate polysilicon layer 114, and the anti-reflective layer 116 deposited on the semiconductor substrate 110.

After deposition of the photoresist 118, a mask of the spaces is used to pattern and develop the photoresist 118 to form the space photoresist structures 118A through 118C on the anti-reflective layer 116. For very precise spacing, the space photoresist structures 118A through 118C are formed by over exposure conditions or by plasma trimming, as shown in FIG. 3.

The polymer 120 is then deposited by spinning over the space photoresist structures 118A through 118C. The polymer 120 is deposited to a thickness greater than that of the thickness of the space photoresist structures 118A through 118C, as shown in FIG. 4. The deposition is of the non-photosensitive polymer by spin coating or plasma polymerization.

The polymer 120 is then subject to chemical-mechanical polishing until the space photoresist structures 118A through 118C are revealed. Other polymer removal techniques may be used.

After the space photoresist structures 118A through 118C have been revealed, they are developed and removed to leave the pattern of the spaces defined by reverse image polymer structures 120A through 120C, as shown in FIG. 5.

After removal of the space photoresist structures 118A through 118C, an isotropic etch forms the polysilicon gate stacks. The polysilicon gate stacks consist of: the anti-reflective layer 116A, the polysilicon gate 114A, and gate dielectric layer 112A; the anti-reflective layer 116B, the polysilicon gate 114C, and the gate dielectric layer 112D; and the anti-reflective layer 116C, the polysilicon gate 114C, and the gate dielectric 114C.

With the removal of the reverse image polymer structures 120A through 120C and the anti-reflective layers 116A through 116C, the polysilicon gates 114A through 114C are formed and ready for further processing.

As would be evident to those skilled in the art, the invention may be used with many different semiconductor materials, such as gallium arsenide, and configurations to manufacture smaller spaces between elements and semiconductors as well as more closely spaced connections between various elements. Similarly, the process may be used in various other areas of manufacturing where the space size is critical.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing semiconductor devices comprising:
    depositing a photoresist over a semiconductor wafer having material deposited thereon in preparation for semiconductor structures to be formed thereon;
    patterning said photoresist with a predetermined pattern;
    exposing said photoresist in said predetermined pattern;
    developing said photoresist in said predetermined pattern;
    trimming said photoresist after developing;
    depositing a polymer over said semiconductor wafer and over said patterned photoresist;
    removing a portion of said polymer to expose said patterned photoresist;
    developing said patterned photoresist to leave a reverse image pattern of said patterned photoresist in said polymer; and
    anisotropically removing said material from said reverse image pattern in said polymer to form a space between said semiconductor structures.

2. The method for manufacturing a semiconductor device as claimed in claim 1 wherein patterning said photoresist provides a pattern of spaces.

3. The method for manufacturing a semiconductor device as claimed in claim 1 wherein depositing said polymer uses a non-photosensitive polymer.

4. The method for manufacturing a semiconductor device as claimed in claim 1 including planarizing of said polymer after depositing said polymer.

5. The method for manufacturing a semiconductor device as claimed in claim 1 wherein developing is a part of a photolithographic process.

6. The method for manufacturing a semiconductor device as claimed in claim 1 wherein developing uses a photolithographic process which overexposes said photoresist.

7. The method for manufacturing a semiconductor device as claimed in claim 1 wherein trimming said photoresist after developing uses plasma trimming.

8. The method for manufacturing a semiconductor device as claimed in claim 1 depositing said photoresist uses a deep ultraviolet light absorbing photoresist.

9. A method for manufacturing semiconductor devices comprising:
    depositing a gate dielectric layer over a semiconductor substrate;
    depositing a gate polysilicon layer over said gate dielectric layer;
    depositing an anti-reflective layer over said gate polysilicon layer;
    depositing a photoresist over said anti-reflective layer;
    patterning said photoresist with a predetermined pattern of spaces;
    exposing said photoresist in said predetermined pattern of spaces;
    developing said photoresist in said predetermined pattern of spaces;
    trimming said photoresist after developing;
    depositing a polymer over said photoresist in said predetermined pattern of spaces;
    removing a portion of said polymer to expose said photoresist in said predetermined pattern of spaces;
    developing said photoresist in said predetermined pattern of spaces to leave a reverse image pattern of said spaces in said polymer; and
    anisotropically removing said anti-reflective layer from said spaces in said polymer;
    anisotropically removing said gate polysilicon layer from said spaces in said polymer; and
    removing said polymer.

10. The method for manufacturing a semiconductor device as claimed in claim 9 wherein patterning said photoresist provides a pattern of spaces.

11. The method for manufacturing a semiconductor device as claimed in claim 9 wherein depositing said polymer uses a spin deposition process to deposit a non-photosensitive polymer.

12. The method for manufacturing a semiconductor device as claimed in claim 9 including hardening said polymer after depositing said polymer and of planarizing of said polymer to expose said photoresist.

13. The method for manufacturing a semiconductor device as claimed in claim 9 wherein developing is a part of a photolithographic process which removes photoresist which has been exposed.

14. The method for manufacturing a semiconductor device as claimed in claim 9 wherein developing uses a photolithographic process which overexposes said photoresist whereby the spaces in said photoresist are reduced in size.

15. The method for manufacturing a semiconductor device as claimed in claim 9 wherein trimming said photoresist after developing uses plasma trimming whereby the size of the spaces in said photoresist can be controlled.

16. The method for manufacturing a semiconductor device as claimed in claim 9 wherein depositing said photoresist uses a deep ultraviolet light absorbing photoresist.

17. A method for manufacturing semiconductor devices comprising:
    depositing a gate oxide layer over a semiconductor substrate;
    depositing a gate polysilicon layer over said gate oxide layer;
    depositing a silicon oxynitride layer over said gate polysilicon layer;
    depositing a deep ultraviolet photoresist over said silicon oxynitride layer;
    patterning said photoresist with a predetermined pattern of spaces;
    exposing said photoresist to deep ultraviolet light in said predetermined pattern of spaces;
    developing said photoresist in said predetermined pattern of spaces;

trimming said photoresist after developing;
depositing a non-photosensitive polymer over said photoresist in said predetermined pattern of spaces;
removing a portion of said polymer to expose said photoresist in said predetermined pattern of spaces;
developing said photoresist in said predetermined pattern of spaces to leave a reverse image pattern of said spaces in said polymer; and
anisotropically removing said silicon oxynitride layer from said spaces in said polymer;
anisotropically removing said gate polysilicon layer from said spaces in said polymer; and
removing said polymer.

18. The method for manufacturing a semiconductor device as claimed in claim 17 wherein depositing said polymer uses a spin deposition process.

19. The method for manufacturing a semiconductor device as claimed in claim 18 including hardening said polymer after depositing said polymer.

20. The method for manufacturing a semiconductor device as claimed in claim 19 including planarizing said polymer after depositing said polymer.

* * * * *